United States Patent
Bischof et al.

(10) Patent No.: US 7,326,593 B2
(45) Date of Patent: Feb. 5, 2008

(54) METHOD OF PRODUCING A PACKAGE FOR SEMICONDUCTOR CHIPS

(75) Inventors: Andreas Bischof, Dresden (DE); Knut Kahlisch, Dresden (DE); Henning Mieth, Jahnsdorf (DE)

(73) Assignee: Infineon Technologies AG, Munich (DE)

( * ) Notice: Subject to any disclaimer, the term of this patent is extended or adjusted under 35 U.S.C. 154(b) by 226 days.

(21) Appl. No.: 10/483,212

(22) PCT Filed: Jul. 4, 2002

(86) PCT No.: PCT/EP02/07439

§ 371 (c)(1),
(2), (4) Date: Oct. 5, 2004

(87) PCT Pub. No.: WO03/007364

PCT Pub. Date: Jan. 23, 2003

(65) Prior Publication Data

US 2006/0211166 A1    Sep. 21, 2006

(30) Foreign Application Priority Data

Jul. 10, 2001   (DE) ................. 101 33 361

(51) Int. Cl.
*H01L 21/00* (2006.01)
(52) U.S. Cl. ............... 438/118; 438/119; 257/E21.499
(58) Field of Classification Search ............... 438/118, 438/119; 257/787, E21.499; 156/289
See application file for complete search history.

(56) References Cited

U.S. PATENT DOCUMENTS

| | | | |
|---|---|---|---|
| 4,906,314 A | 3/1990 | Farnworth et al. | |
| 5,030,308 A | 7/1991 | Sheyon et al. | |
| 5,169,056 A | 12/1992 | Reele et al. | |
| 5,504,374 A | 4/1996 | Oliver et al. | |
| 5,536,970 A * | 7/1996 | Higashi et al. | 257/676 |
| 5,937,279 A | 8/1999 | Sawada et al. | |
| 5,972,735 A | 10/1999 | Dominic | |
| 6,114,753 A * | 9/2000 | Nagai et al. | 257/668 |
| 6,118,183 A * | 9/2000 | Umehara et al. | 257/783 |
| 6,150,194 A * | 11/2000 | Sakaguchi et al. | 438/118 |

FOREIGN PATENT DOCUMENTS

| | | |
|---|---|---|
| DE | 199 21 113 A 1 | 11/2000 |
| EP | 0 959 498 A1 | 11/1999 |
| JP | 10135249 A | 5/1998 |
| JP | 10-214849 | 8/1998 |
| JP | 2000299328 A | 10/2000 |

OTHER PUBLICATIONS

WIKIPEDIA, Glass transition temperature, http://en.wikipedia.org/wiki/Glass_transition, Jun. 17, 2007, pp. 5.
Moon et al., Evaluation of temperature-dependent adhesive performance via combinatorial probe tack measurements, Review of Scientific Instruments 76, Nov. 15, 2004, pp. 6.

* cited by examiner

*Primary Examiner*—Eugene Lee
*Assistant Examiner*—Mohammad Timor Karimy
(74) *Attorney, Agent, or Firm*—Dicke, Billig & Czaja PLLC

(57) ABSTRACT

The inventive method is based on the a idea of releasing a mechanical connection between the semiconductor chip and the supporting substrate during the manufacturing of the packing. The mechanical connection required for producing the electrical contacts between the semiconductor chip and the supporting substrate ensues only temporarily. As a result, a critical interface in the packing is removed thereby resulting in distinctly reducing the thermomechanical stresses.

13 Claims, 2 Drawing Sheets

METHOD OF PRODUCING A PACKAGE FOR SEMICONDUCTOR CHIPS

CLAIM FOR PRIORITY

This application is a national stage of PCT/EP02/07439, published in the German language on Jan. 23, 2003, which claims the benefit of priority to German Application No. DE 101 33 361.7, filed on Jul. 10, 2001.

TECHNICAL FIELD OF THE INVENTION

The present invention relates to a method of producing a package for semiconductor chips, and in particular, to a method of producing miniature packages or miniature housings for semiconductor chips.

BACKGROUND OF THE INVENTION

With the increasing integration in information and communication technology, the requirements imposed on the constructing and connecting techniques are becoming ever greater. Ever higher requirements are imposed in particular on the package of the semiconductor chips. The package is the main medium for connecting the integrated circuit on the semiconductor chip to the rest of the system. A further reduction in the size of the structures on the semiconductor chip would be largely senseless if there were not a corresponding development in the packaging of the semiconductor chips.

To satisfy this high requirement on the packaging of the semiconductor chips, in recent years packaging methods for semiconductor chips have been proposed and developed under the designation "Chip Size Packaging" (CSP), in which the space requirement of the packaged semiconductor chip is not greater than approximately 1.2 times the unpackaged semiconductor chip. Accordingly, the integration density on the system board can be increased and parasitic effects of the package reduced, whereby ultimately the speed of the end product is significantly increased.

In the production of miniature housings for semiconductor chips, generally a specially preprocessed carrier substrate is used. This carrier substrate may in this case be designed such that it is both relatively flexible and relatively rigid_ Generally serving for attaching the semiconductor chip on the carrier substrate are full-area chip bonding tapes or elastomer layers, which in addition to fixing the semiconductor chip also serve for minimizing mechanical stresses of the overall arrangement. In particular, in the case of these technologies, the semiconductor chip is permanently connected to the carrier substrate by means of the double-sided adhesive chip bonding tapes or elastomer layers.

At the same time, packages of this type often have to satisfy extreme requirements with respect to stress absorption. In particular, it is necessary to compensate largely for thermally induced stresses, caused by different coefficients of expansion (CTE) of individual components of the package. In this respect it is generally attempted to reduce the thermomechanical stresses by means of the double-sided adhesive chip bonding tapes or elastomer layers, which to a certain extent have stress-absorbing properties. Unfortunately, so far there is no known method or material that satisfies this requirement satisfactorily. Therefore, instances of delamination in the package or damage to the semiconductor chip are repeatedly encountered.

SUMMARY OF THE INVENTION

The present invention provides a method of producing a package for semiconductor chips which largely avoids the difficulties mentioned and which makes possible, in particular, a low-cost, virtually stress-free electrical bonding of the chip for miniature housings.

anying drawings.

According to one embodiment of the invention, there is a method of producing a package for semiconductor chips including a carrier substrate is provided, at least one adhesive layer, which loses its adhesive property when it is heated above a defined temperature, is applied to the carrier substrate, a semiconductor chip is applied to the carrier substrate and fixed by the adhesive layer, a curable composition is applied and at least one heat treatment is carried out, the temperature of the heat treatment lying at least temporarily above the temperature at which the adhesive layer loses its adhesive property, so that the adhesive layer loses its adhesive property and the curable composition cures.

The invention has one advantage that, during the completion of the package, the mechanical connection between and the carrier substrate is released again. The mechanical connection between the semiconductor chip and the carrier substrate takes place temporarily. As a result, a critical interface in the package is removed, which has the consequence of a significant reduction in the thermomechanical stresses. Accordingly, the completed package is significantly more reliable, which is in turn reflected in a reduction in the costs.

With the method according to the invention, miniature packages or miniature housings for semiconductor chips (CSP) can be produced in particular.

According to a preferred embodiment of the invention, a curable first heat treatment is carried out, so that the curable composition solidifies, the temperature of the first heat treatment lying above the temperature at which the adhesive layer loses its adhesive property, so that the adhesive layer loses its adhesive property and the curable composition cures. This preferred embodiment of the invention has an advantages that, in the second heat treatment, the process parameters can be set exactly as required for a reliable and permanent release of the adhesive layer. At the same time, the second heat treatment acts like a post-curing process for the curable composition.

According to a further preferred embodiment of the invention, before the curable heat treatment the semiconductor chip is electrically connected to the carrier substrate by wire or film-carrier bonding (lead bonding, TAB), the bonding temperature lying below the temperature at which the adhesive layer loses its adhesive property. According to a further preferred embodiment of the invention, the adhesive layer is applied by a punching process. Furthermore, it is preferable if a first adhesive layer, a base layer and a second adhesive layer are applied, at least the second adhesive layer property losing its adhesive property when it is heated above a defined temperature. In this case, it is preferred in particular if the first adhesive layer, the base layer and the second adhesive layer are jointly applied in the form of a film. According to a further preferred embodiment of the invention, a polyimide, BT or FR4 substrate is used as the carrier substrate. Furthermore, it is preferred if the carrier substrate has at least one bonding channel.

According to a further preferred embodiment of the invention, a mixture of silicone and epoxy resin is used as the curable composition. The use of a mixture epoxy resin has the advantage over the use of pure epoxy resin that the encapsulating composition has a significantly higher flexibility even after curing. If, however, the production of a relatively rigid package is the aim, it is advantageous to use pure epoxy resin as the curable composition.

According to a further preferred embodiment of the invention, the first heat treatment is carried out at a temperature between 130° and 150° C. and subsequently a second heat treatment is carried out at a temperature between 150° and 170° C.

According to a further preferred embodiment of the invention, the nubbins are applied to the carrier substrate by a printing process and a subsequent heat treatment. Furthermore, it is preferred if the curable composition is applied by a printing process or a compression-molding process.

BRIEF DESCRIPTION OF THE DRAWINGS

The invention is presented in more detail below on the basis of figures of the drawing, in which.

DETAILED DESCRIPTION OF THE INVENTION

FIGS. 1-6 show an embodiment of the method according to the invention of producing a package for semiconductor chips. For this purpose, in a first step a carrier substrate 1, for example a polyimide substrate, which, for later receiving bonding wires, has a central channel 5 (slot) (FIG. 1), is provided. Furthermore, interconnects and landing pads (not shown) for the micro-ball grid array to be produced later are provided on one side of the carrier substrate (underside), whereby the carrier substrate 1 is connected for example to a system board. In this case, the structure shown in FIG. 1 generally represents only a detail of a larger carrier substrate 1, which serves for the simultaneous attachment of a number of semiconductor chips. For reasons of overall clarity, however, only the conditions for one semiconductor chip at a time are shown below.

Figure 1:
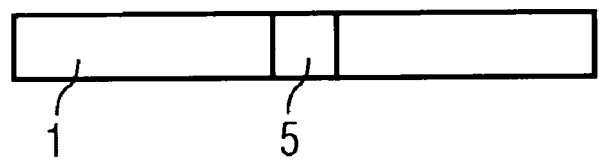
FIGS. 1-6 show an embodiment of the invention of producing a package for semiconductor chips.
Figure 2:
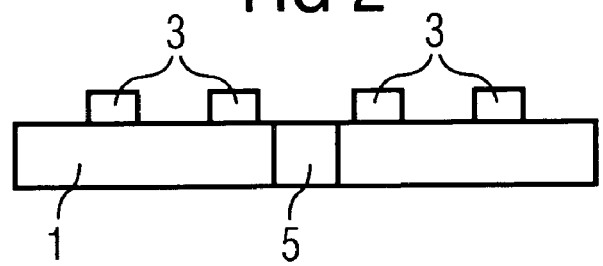

Subsequently, nubbins 3 are applied to the carrier substrate 1, for example by means of a printing process, and are cured in an oven process. Silicone is used with preference as the material for the nubbins 3. These nubbins 3 also serve for assisting the later wire bonding. Consequently, a carrier substrate 1 with nubbins 3 arranged on it is prepared. The resulting situation is represented in FIG. 2.

Figure 3:
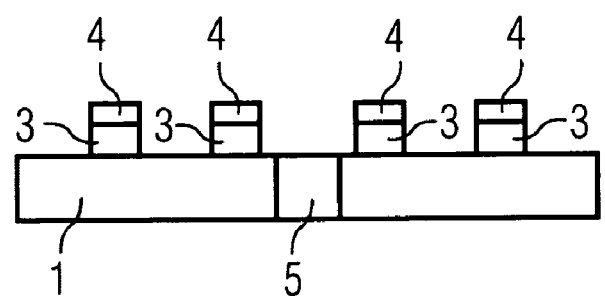
Figure 4:
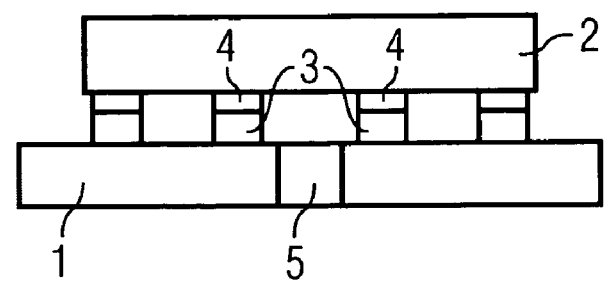
Figure 5:
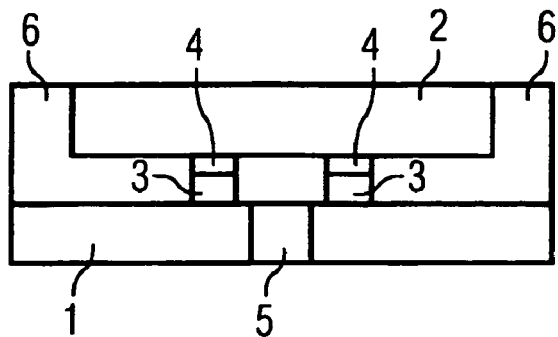

Subsequently, an adhesive layer 4 that is released under the influence of a defined temperature is applied to the nubbins 3. In this respect, in the case of this embodiment of the method according to the invention, the adhesive layer 4 is applied to the nubbins 3 as part of a film by a punching process. A film of this type generally comprises in addition to the adhesive layer 4 a base layer (not shown), for example polyester, and a further adhesive layer (not shown), the base layer being arranged between the two adhesive layers. Films of this type are available, for example, under the designation REVALPHA for thermal release tape from the company Nitto Denke. The situation resulting from this is represented in figure 3.

After that, a semiconductor chip 2 is attached on the carrier substrate 1 by means of the adhesive layer 4 (FIG. 4) and the electrical connection between the semiconductor chip 2 and the carrier substrate 1 is made in the bonding channel 5 by means of fine connecting wires (not shown), for example gold wires. The bonding temperature in this case lies below what is known as the "heat release" temperature, at which the adhesive layer 4 loses its adhesive property.

The overall construction is then encapsulated in a curable composition or encapsulating composition 6 adapted to the coefficient of thermal expansion of the semiconductor chip. For this purpose, the encapsulating composition 6 is applied to the structure shown in FIG. 4 by a printing process. A mixture of silicone and epoxy resin is used as the encapsulating composition 6. The use of a mixture of silicone and epoxy resin has the advantage over the use of pure epoxy resin that the encapsulating composition 6 has a significantly higher flexibility even after curing. Alternatively, instead of a mixture of silicone and epoxy resin, other materials, for example pure epoxy resin, may also be used as what is known as compression-molding process.

For the curing of the encapsulating compound 6, after that a first heat treatment is carried out, so that the encapsulating composition 6 solidifies, the temperature of the first heat treatment lying below the temperature at which the adhesive layer 4 loses its adhesive property. The first heat treatment is preferably carried out at a temperature between 130° and 150° C. for approximately one to two hours.

After that, a second heat treatment is carried out, the temperature of the second heat treatment lying above the temperature at which the adhesive layer 4 loses its adhesive property, so that the adhesive layer 4 loses its adhesive property and the encapsulating composition 6 fully cures. The second heat treatment is preferably carried out at a temperature between 150° and 170° C. for approximately 10 to 15 minutes. This procedure has the advantage that, during the second heat treatment, the process parameters can be set exactly as required for a reliable and permanent release of the adhesive layer 4. At the same time, the second heat treatment acts like a post-curing process for the encapsulating composition 6.

Figure 6:
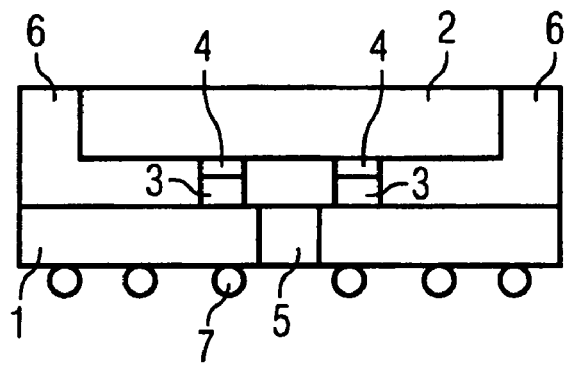
Figure 7:
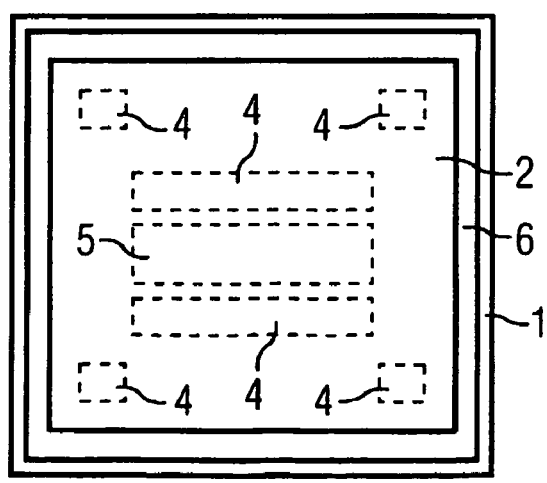
FIG. 7 shows a plan view of a package produced according to the invention.

After that, a micro-ball grid array 7 (or some other connecting means) is produced on the side of the carrier substrate 1 lying opposite the semiconductor chip 2, said array serving for the electrical and mechanical bonding of the complete arrangement on a printed circuit board which is not represented (FIG. 6). FIG. 7 shows a plan view of a package produced in this way.

The method according to the invention has the advantage that, during the completion of the package, the mechanical connection between the semiconductor chip and the carrier substrate is released again. The connection necessary for establishing the contacts between the semiconductor chip and the carrier substrate takes place only temporarily. As a result, a critical interface in the package is removed, which has the consequence of a significant reduction in the thermomechanical stresses.

The invention claimed is:

1. A method of producing a package for semiconductor chips, comprising:
   providing a carrier substrate;
   applying at least one adhesive layer, which loses its adhesive property when it is heated above a defined temperature, to the carrier substrate;
   applying a semiconductor chip to the carrier substrate and fixing it thereto by the adhesive layer; and
   applying a curable composition on the carrier substrate surrounding the semiconductor chip, the temperature of the heat treatment lying at least temporarily above the temperature at which the adhesive layer loses its adhesive property, so that the adhesive layer loses its adhesive property and the curable composition cures.

2. The method as claimed in claim 1, wherein the carrier substrate is provided with nubbins arranged on it is provided and the adhesive layer is applied to the nubbins.

3. The method as claimed in claim 2, wherein the nubbins are applied to the carrier substrate by a printing process and a subsequent heat treatment.

4. The method as claimed in claim 1, wherein the at least one heat treatment includes a first and a second heat treatment, the temperature of the first heat treatment lying below the temperature at which the adhesive layer loses its adhesive property and such that the curable composition solidifies during the first heat treatment and subsequently the second heat treatment is carried out, the temperature of the second heat treatment lying above the temperature at which the adhesive layer loses its adhesive property, so that the adhesive layer loses its adhesive property and the curable compositions cures.

5. The method as claimed in claim 4, wherein the first heat treatment is carried out at a temperature between 130° and 150° C. and subsequently the second heat treatment is carried out at a temperature between 150° and 170° C.

6. The method as claimed in claim 1, wherein applying the at least one adhesive layer includes applying a first adhesive layer, a base layer and a second adhesive layer, at least the second adhesive layer losing its adhesive property when it is heated above the defined temperature.

7. The method as claimed in claim 6, wherein the first adhesive layer, the base layer and the second adhesive layer are jointly applied in the form of a film.

8. The method as claimed in claim 1, wherein a polyimide, BT or FR4 substrate is used as the carrier substrate.

9. The method as claimed in claim 1, wherein the carrier substrate has at least one bonding channel.

10. The method as claimed in claim 1, wherein a mixture of silicone and epoxy resin or pure epoxy resin is used as the curable composition.

11. The method as claimed in claim 1, wherein the semiconductor chip is electrically connected to the carrier substrate by wire or film-carrier bonding, the bonding temperature lying below the temperature at which the adhesive layer loses its adhesive property.

12. The method as claimed in claim 1, wherein the curable compositions is applied by a printing process or a compression-molding process.

13. The method as claimed in claim 1, wherein the adhesive layer is applied by a punching process.

* * * * *